United States Patent [19]

Quach

[11] Patent Number: 5,336,930

[45] Date of Patent: Aug. 9, 1994

[54] BACKSIDE SUPPORT FOR THIN WAFERS

[75] Inventor: Tony K. Quach, Kettering, Ohio

[73] Assignee: The United States of America as represented by the Secretary of the Air Force, Washington, D.C.

[21] Appl. No.: 904,618

[22] Filed: Jun. 26, 1992

[51] Int. Cl.$^5$ .................... H01L 29/78; H01L 29/44
[52] U.S. Cl. .................... 257/774; 257/622
[58] Field of Search .................... 257/774, 622, 744

[56] References Cited

U.S. PATENT DOCUMENTS

| 3,648,131 | 3/1972 | Stuby | 257/774 |
| 4,447,291 | 5/1984 | Schulte | 257/774 |
| 4,507,674 | 3/1985 | Gaalema | 257/622 |
| 4,789,645 | 12/1988 | Calviello et al. | 437/51 |
| 4,849,376 | 7/1989 | Balzan et al. | 437/228 |
| 4,965,218 | 10/1990 | Geissberger et al. | 437/41 |
| 4,970,578 | 11/1990 | Tong et al. | 257/774 |
| 4,972,250 | 11/1990 | Omori et al. | 357/54 |
| 4,977,100 | 12/1990 | Shimura | 437/44 |

FOREIGN PATENT DOCUMENTS 61-263284  11/1986  Japan .................... 257/774

*Primary Examiner*—Sara W. Crane
*Assistant Examiner*—Stephen D. Meier
*Attorney, Agent, or Firm*—Gerald B. Hollins; Thomas L. Kundert

[57] ABSTRACT

An additional layer of electrically insulating material is added to the backside of thin wafers, especially wafers made from brittle semiconductor material such as gallium arsenide and comprising integrated circuits of, for example, the microwave monolithic integrated circuit type. The added layer of material is used to add mechanical rigidity and abuse tolerance to the otherwise quite fragile wafer, and is especially useful during probe testing of circuit die located on these fragile wafers and in the steps preceding and following probe testing. Preferably, the added layer is made from silicon nitride or silicon dioxide, or one of several diamond-related materials. The former materials provide the advantage of ready availability, low cost, and possibly already accomplished use in the wafer's fabrication; the latter diamond-related materials have the significant advantages of notable hardness, along with desirable heat conducting properties. The disclosed additional layer may be used only temporarily during the manufacturing and fabrication sequence, in which case its removal is accomplished prior to wafer scribing and breaking, or may be allowed to remain on the completed die.

4 Claims, 2 Drawing Sheets

BACKSIDE SUPPORT FOR THIN WAFERS

RIGHTS OF THE GOVERNMENT

The invention described herein may be manufactured and used by or for the Government of the United States for all governmental purposes without the payment of any royalty.

BACKGROUND OF THE INVENTION

This invention relates to the field of semiconductor wafer processing, and to a strengthened-wafer reduction of breakage mishaps in the testing and handling of thinned and brittle wafers of, for example, the gallium arsenide microwave integrated circuit type.

The electrical properties of some semiconductor wafer materials, notably gallium arsenide and combinations of other materials with gallium arsenide, require wafer circuit die thicknesses that are in the range of 100 micrometers (100 $\mu$m). In fabricating integrated circuit versions of the well-known "Stripline®" electrical transmission line, for example, it is found that desirable values of transmission line characteristic impedance plus conductor physical size and separation dictates that transmission line conductor members be located only 100 $\mu$m or less thickness of gallium arsenide material away from a conductive ground plane member.

Insofar as electrical properties of the resulting circuits are concerned, this 100 $\mu$m thickness dimension is therefore readily acceptable. In fact, the only major difficulty with such thin wafers and circuit die is the considerable wafer fragility and handling difficulties introduced by such thicknesses (a human hair is about 60 $\mu$m in diameter, the thickness of a piece of paper is about 150 $\mu$m). The necessity of handling wafers and the circuit die removed therefrom numerous times prior to their mounting in an integrated circuit package is well known in the integrated circuit art. One especially difficult portion of this handling occurs during the probe testing of fully fabricated wafers—before the host wafer is scribed and broken or otherwise divided into individual circuit die members.

Preferably such probe testing is accomplished while a full sized fabricated wafer of two-inch diameter, for example, is held on the faceplate of a vacuum chuck member. Here it is subjected to individual circuit testing by way of probe fingers that are dropped onto connecting pads of the completed circuit. Clearly the steps of presenting a fully fabricated thin and brittle gallium arsenide wafer in this posture and the physical stresses of receiving multiple probe fingers in numerous different locations across the face of the wafer, is attended by an undesirable degree of breakage hazard.

In the past, this breakage hazard has been met by a backside mounting of completed wafers onto a carrier member such as a piece of glass or on a more rugged semiconductor wafer—such as a silicon wafer of normal thickness. Usually this mounting is accomplished with the aid of a temporary attachment material such as low melting temperature wax with the wafer being removed from such protective attachment by heating following the probe testing operation. Clearly the cost and complexity of this protective arrangement during wafer probe testing is an undesirable complication and expense in a circuit fabrication sequence. The present invention apparatus and method provide a viable alternative for this undesirable prior arrangement.

The patent art reveals a number of inventions which are of background and general interest with respect to the present invention. Included in this patent art is the U.S. Pat. No. 4,965,218 of A. E. Geissberger et al, which is concerned with a self-aligning gate arrangement in an integrated circuit. An interesting aspect of the Geissberger et al patent with respect to the present invention appears in column 5, line 31 where use of silicon nitride or other dielectric material as a passivation layer is described. In this use the passivation is applied over a single surface gallium arsenide wafer during a circuit fabrication sequence.

As is indicated at column 6, line 31 of the Geissberger et al patent, the silicon nitride passivation layer is also removed during a later part of the circuit fabrication sequence. The Geissberger et al patent also speaks at column 9, line 36 of using a dielectric encapsulant layer in order to protect the gallium arsenide wafer from a disassociation—wherein arsenic vaporization may occur as a result of high-temperature annealing. The Geissberger et al encapsulant material is said to be "possibly silicon nitride" at column 9, line 52 of the patent. The Geissberger et al patent also mentions the use of dielectric encapsulants of silicon nitride or silicon oxynitride materials at a number of other locations including column 20, line 50, column 21, line 7, and column 22, lines 55+. The latter location also mentions use of contact vias passing through the dielectric material. Although the Geissberger et al patent discloses the use of a silicon nitride layer on a gallium arsenide substrate, the location, accomplished function, and other aspects of this layer differ significantly from the arrangement of the present invention.

The patent art of interest also includes U.S. Pat. No. 4,849,376 issued to M. L. Balzan and E. E. Geissberger et al. The Balzan and Geissberger et al patent appears to use silicon nitride materials in combination with a gallium arsenide wafer for the same dielectric and encapsulation purposes employed in the above described Geissberger et al patent. Specific references to the use of silicon nitride layers in combination with a gallium arsenide wafer appear in the Balzan and Geissberger et al patent at column 5, line 20, column 5, line 65, column 6, line 18, column 9, line 37, and with several references to the silicon oxynitride material appearing in column 13 and in column 20 at line 48. As in the case of the Geissberger et al patent, the location and function of the layers taught in the Balzan/Geissberger et al patent and other differences distinguish the Balzan/Geissberger et al patent from the present invention.

This art also includes the U.S. Pat. No. 4,789,645 of J. A. Calviello et al, which is concerned with a top-down single furnace process for fabricating a microwave monolithic integrated circuit—a circuit of a type wherein active devices are later bonded to the passive microwave monolithic integrated circuit formed during the top-down processing steps. The Calviello et al patent also contemplates the use of a silicon dioxide layer to reduce crystal damage during the sputtering of silicon dioxide and silicon nitride dielectric layers. Such layers act as passivating films and in the capacity of improving isolation between circuits and N and N+ layers in the structure (see column 7, lines 44–54). The Calviello et al patent also indicates the use of silicon nitride material for dielectric purposes at column 3, line 45 and column 4, line 49. The location and function of silicon nitride layers and even the related material layers in the Calviello et al structure differ significantly from that of the present invention.

The patent art of interest also includes U.S. Pat. No. 4,972,250 issued to M. Omori et al, a patent concerned with protective coating or passivation layers employed during (or as a final step in) the fabrication of an integrated circuit die. It is notable that the Omori et al patent teaches against the use of materials such as silicon dioxide and silicon nitride overlaying gold and in lieu thereof espouses the use of diamond-like carbon material dispersed in a relatively thin layer over the top of an integrated circuit array. Both location of the film layer in the Omori et al patent and its passivation function differ significantly from teachings of the present invention.

This patent art also includes U.S. Pat. No. 4,977,100 issued to T. Shimura which is concerned with the fabrication of a MESFET—a MESFET used in a monolithic microwave integrated circuit. The Shimura patent speaks of three hundred angstrom thick films of silicon dioxide used during the fabrication process and of refractory metal materials such as tungsten silicon nitride used for gate electrode fabrication. The teachings of the Shimura patent are also readily distinguishable from the present invention, however.

SUMMARY OF THE INVENTION

In the present invention a fragile thin semiconductor wafer of material such as gallium arsenide is supplemented in mechanical strength by the addition of a layer of material, such as silicon nitride, silicon dioxide, or a diamond-related material, to the wafer's backside during selected portions of the wafer fabrication process. Especially this layer is used during the interval of probe testing a completed wafer or a completed die, however, it may be arranged for permanent retention on the completed and mounted circuit die. The invention is especially applicable to microwave monolithic integrated circuit (MMIC) die which are underlaid by a layer of conductive film formed on the wafer's backside to act as a ground plane member.

It is an object of the present invention, therefore, to provide a strengthened semiconductor wafer.

It is another object of the invention to enable the economic use of thin and fragile semiconductor wafers of material such as gallium arsenide.

It is another object of the invention to provide a gallium arsenide wafer strengthening arrangement which enables safe handling of wafers having a thickness of no more than 100 $\mu$m.

It is another object of the invention to provide a wafer support arrangement that is particularly applicable to microwave monolithic integrated circuit fabrication.

It is another object of the invention to provide a wafer backside support arrangement that can be conveniently fabricated from materials commonly used in integrated circuit processes.

It is another object of the invention to provide an overall wafer fabrication method which includes steps providing a wafer backside support arrangement.

It is another object of the invention to provide a wafer backside supporting arrangement which may be used either temporarily during the formation and testing of an integrated circuit die or which may electively be allowed to remain in place during circuit usage.

It is another object of the invention to provide a wafer backside supporting arrangement which can employ one of several deposition-compatible materials.

It is another object of the invention to provide a gallium arsenide wafer backside support arrangement which utilizes silicon nitride backside material.

It is another object of the invention to provide a gallium arsenide wafer backside support arrangement which utilizes one of several diamond-related materials in the backside support.

Additional objects and features of the invention will be understood from the following description and claims and the accompanying drawings.

These and other objects of the invention are achieved by the method for producing microwave monolithic integrated circuit die comprising the steps of: fabricating on predetermined circuit die areas of a semiconductor wafer, multiple layered microwave monolithic electrical circuits using a multiple step multiple material wafer front surface accomplished fabrication sequence; mounting the circuit containing wafer in a front surface down posture on a wafer carrier member; removing semiconductor material uniformly from a backside surface of the front surface mounted wafer until a newly exposed backside surface of a thinned wafer having predetermined thickness less than two hundred micrometers remains; vaporizing electrical conductor material onto the newly exposed wafer backside surface; depositing onto the conductor bearing wafer backside surface a covering integral thin film layer of wafer physical strength supplementing material; separating the backside strengthened wafer from the wafer carrier member; testing the separated wafer electrical circuits individually, via probe connections with front surface circuit pads, for electrical functionality; and removing electrically functional circuit die from the wafer.

DETAILED DESCRIPTION

Figure 1:
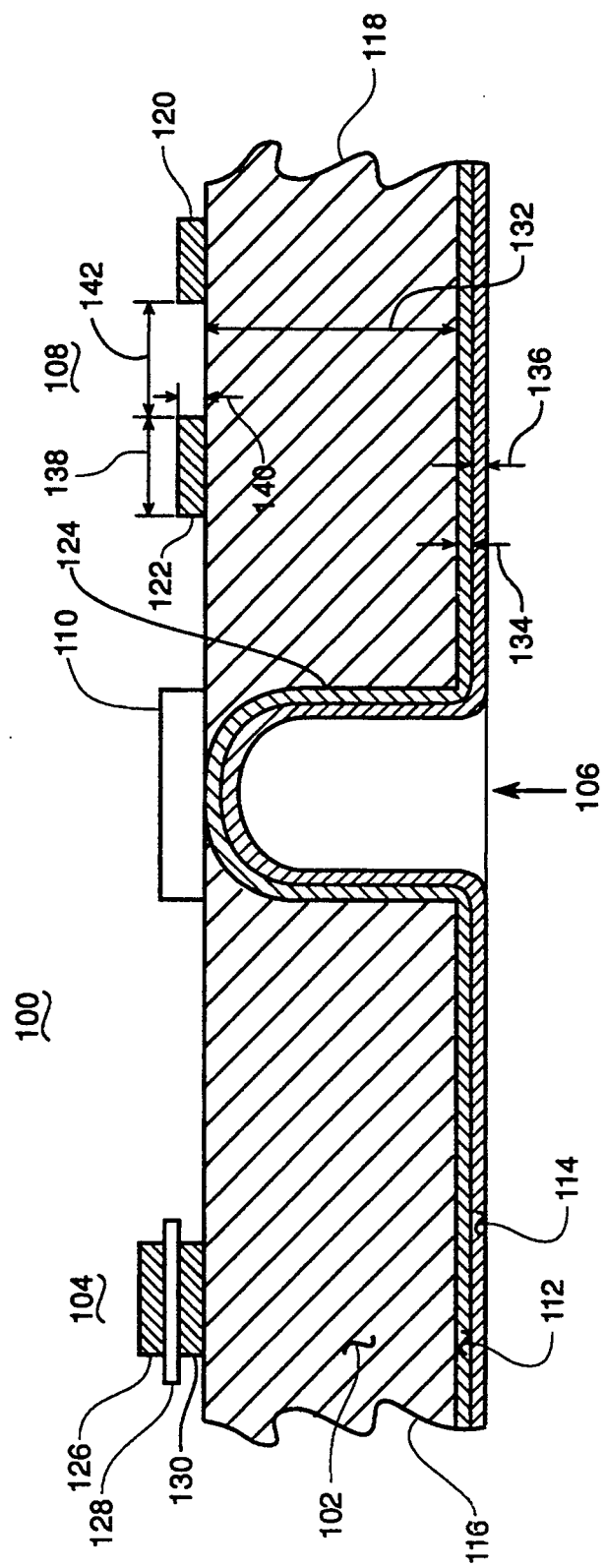
FIG. 1 shows a cross-sectional view of a microwave monolithic integrated circuit having a backside wafer support film in accordance with the invention.

FIG. 1 in the drawings shows a cross-sectional view (not drawn to scale) of a section from a microwave monolithic integrated circuit (MMIC) which is made in accordance with the present invention. The FIG. 1 MMIC section 100 includes a substrate member 102, an electrical capacitor member 104, a contact via 106, a transmission line pair of conductors 108 and a contact pad 110. The capacitor 104 transmission line 108, and contact pad 110 are located on what may be termed the "top" or front side of the substrate member 102. On the opposite face of the substrate member 102 is disposed a metallic conductor member 112. A substrate strengthening layer of electrical insulating material 114 is disposed over the metallic conductor member 112. As is indicated by the broken lines at 116 and 118, the section 100 is a portion of a larger and more complex complete MMIC circuit die which is intended for use in processing, for example, the microwave radio frequency signals as may occur in an airborne radar apparatus.

Additional details which are shown in the FIG. 1 MMIC section 100 include the two conductors 120 and 122 which comprise the transmission line 108. These conductors have the cross-sectional width indicated at 138 and the thickness indicated at 140, and are separated by the distance 142. Also shown in FIG. 1 are details of the contact via 106 which enables electrical contact between one or more electrical nodes of the front surface electrical circuit and the backside metallic electrical conductor 112 of the FIG. 1 apparatus.

In the FIG. 1 circuit section 100, this front side to backside electrical connection is shown to be made to the contact pad 110. At its top surface, this pad also serves as a point of electrical connection to the FIG. 1 circuit in the finally packaged use of the FIG. 1 circuit section and as a point of elecrical connection during probe testing of the FIG. 1 circuit section. Such probe testing occurs during a segregation of good from bad circuit die on the fully fabricated wafer of circuits from which the FIG. 1 section is obtained.

The contact via 106 is shown in the FIG. 1 circuit section to include the curved sidewall portions 124 which result from via formation by way of a chemical etching step. Other formation arrangements such as a reactive ion etch are known to provide more nearly square sidewalls for the via 106. In MMIC devices of the type described herein, the contact via 106 is usually provided with an upper surface intersection diameter in the range of 100 μm and a lower surface diameter near 200 μm when formed by the chemical (wet) etching processes. The difference in these diameters is less in MMIC wafers using the reactive ion etch processing.

The capacitor 104 in the FIG. 1 MMIC section is shown to include the electrical insulating layer 128 which is disposed between the two metallic conductors 126 and 130. Additionally shown in FIG. 1 are the thickness dimensions 132, 134 and 136 for the substrate member 102, the metallic conductor member 112 and the substrate strengthening layer 114.

The substrate member 102 in the FIG. 1 MMIC section may be comprised of any of the commonly used integrated circuit semiconductor materials such as silicon or gallium arsenide, however, the latter gallium arsenide material is preferred for MMIC circuit fabrication. Gallium arsenide for use in circuit arrangements of the FIG. 1 type is often supplied in the form of wafers having several hundred micrometers of thickness. These wafers are conveniently used in the monolithic circuit fabrication sequence employed for the MMIC circuit of the section 100.

These supplied wafers are usually of several hundred micrometers thickness, a thickness of 625 μm, for example, is commonly employed. After the wafer fabrication sequence, wherein the wafer is covered with several electrical circuits, the wafer is frequently treated as by mechanical abrasion techniques to reduce the remaining thickness to a value near 100 μm. In the case of power MMIC devices, even thicknesses as low as 75 μm or 50 μm are sometimes used in order to obtain desirable electrical characteristics and efficient thermal energy conduction through the wafer material. Additional details concerning this thickness reduction as it is used in the context of the present invention are disclosed in connection with FIG. 2 of the drawings herein.

The metallic conducting layer 112 in the FIG. 1 MMIC section serves as a ground plane member for the circuit and is also significant with respect to determining the characteristics of the transmission line 108. As is well known in the Microstrip ® and transmission line art, there exists a degree of tradeoff between the thickness 132 of a member separating the conductors 120 and 122 from the ground plane member 112 and the conductor dimensions required to obtain a predetermined value of transmission line characteristic impedance. According to this tradeoff, a greater thickness in the substrate member 102 at 132 requires increased dimensions at 138, 140 and 142 for a given characteristic impedance. It is therefore desirable to maintain the thickness of an MMIC wafer as low as is practically feasible in a space efficient MMIC layout.

As a result of the brittle nature of the preferred gallium arsenide material in the substrate 102 and this need to employ minimum wafer thicknesses, it is found that MMIC wafers are susceptible to great difficulty and breakage cost during even skilled handling in manufacturing clean rooms. A particularly critical part of this handling difficulty occurs during finished wafer probe testing. In probe testing, functional circuit die are segregated from non-functional or defective circuit die on the integral wafer by way of energizing each circuit die and supplying input and output signals thereto through a series of spring-loaded "probe fingers". These fingers contact selected essential circuit pads of each circuit or die on the wafer, such as the pad 110, while the finished wafer is retained on a planar surface in a testing apparatus. Such retention is usually accomplished by way of lowered pressure or vacuum applied between the wafer backside and the planar "chuck" member of the testing apparatus.

Clearly the handling of completed wafers onto and off-of such a chuck by either manual techniques using tweezers and the like or by automated equipment is fraught with danger of physical harm to a fragile and easily-broken wafer. In addition, the physical stresses attending plural probe contacting of wafer pads can, in instances of an extremely thin wafer, be a damaging event.

The contact via 106 is of course intended to be representative of a plurality of such structures which may be disposed across the lower or backside surface of the MMIC wafer. These contacts to achieve circuit connections to the relatively low electrical impedance common potential of the ground plane formed by the conductor 112 and at selected appropriate points in the MMIC circuit network. As shown in the FIG. 1 drawing, the contact via 106 is located near but not at the distal edge of the MMIC section, as is the contact pad 110.

According to one aspect of the present invention, the provision of the additional substrate strengthening layer of electrical insulation at 114 in the FIG. 1 MMIC provides a significant improvement to the damage-susceptible, brittle wafer environment. Additional information concerning the layer 114 and its accomplishment during the wafer fabrication process are disclosed herein in connection with FIG. 2 of the drawings.

In military MMIC circuit arrays, it is common practice to fabricate the conductive layer 112 from metallic gold and to provide this layer in a thickness between 3 and 10 microns; this thickness is therefore maintained over both the planar areas of the backside surface and into the via wells as is illustrated in FIG. 1. In circuits of this type, moreover, the strengthening layer 114 is preferably fabricated from materials such as silicon nitride, silicon dioxide, monocrystalline diamond, polycrystalline diamond, or diamond-like carbon. The latter three diamond related of these materials for the thin film layer 114 are especially desirable because of their high thermal conductivity properties and the beneficial effects on energy dissipation and circuit cooling that are obtained with this high thermal conductivity.

For the mechanical strength increasing primary purpose of the thin film layer 114, however, the silicon nitride and silicon dioxide materials are of lower cost and provide a significant benefit with respect to the fragile wafer difficulty described above. When fabricated from silicon nitride material, the thin film layer 114 preferably is provided with a thickness 136 which ranges between 0.3 and 0.6 micrometers, a thickness of 3000 angstroms to 6000 angstroms.

Figure 2:
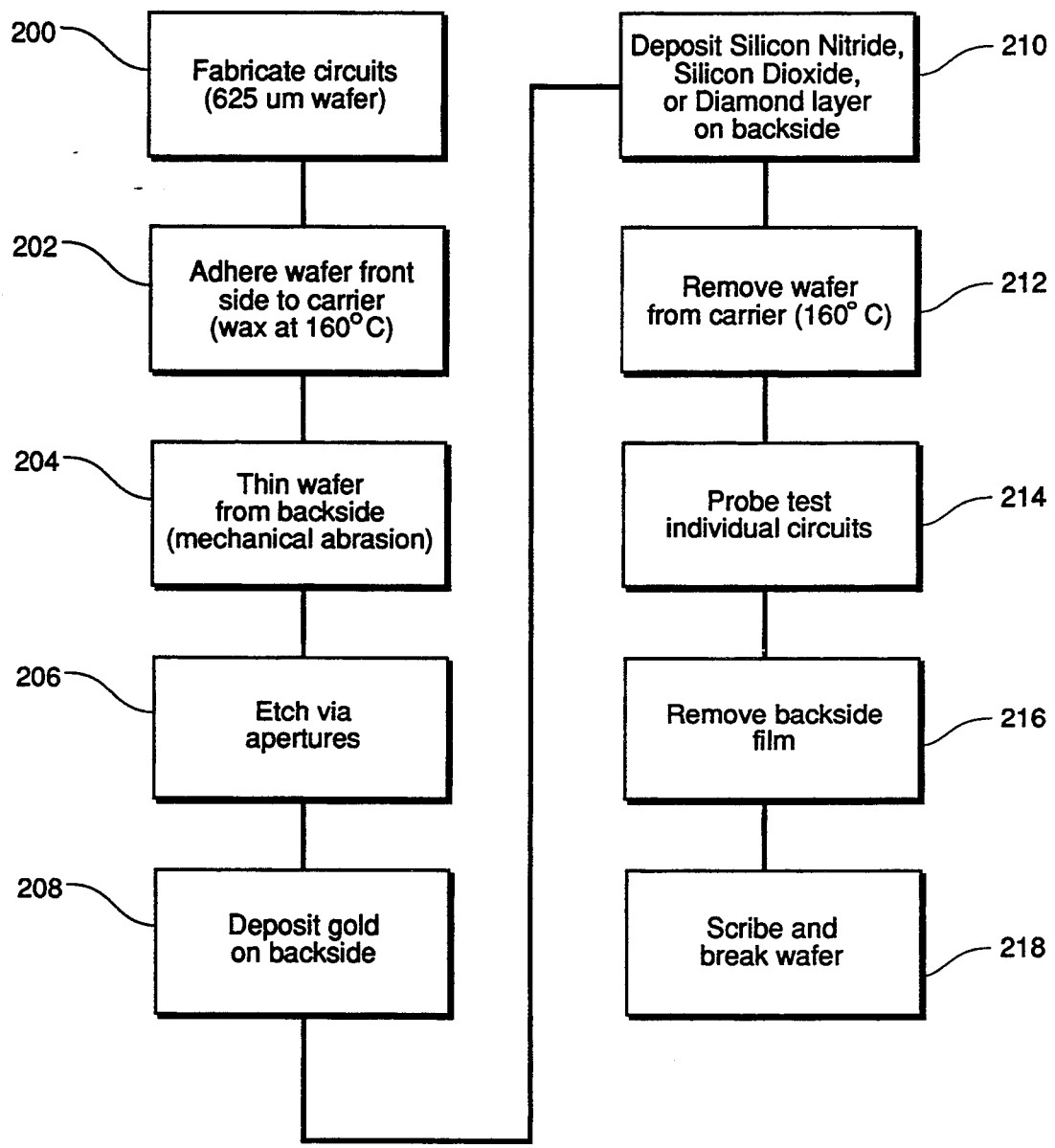
FIG. 2 shows a fabrication process to produce circuit die in accordance with the invention.

FIG. 2 in the drawings shows a block diagram of a method for fabricating integrated electrical circuits of the FIG. 1 type. In the FIG. 2 fabrication sequence a large plurality of wafer fabrication steps—steps typically involving multiple occurrences of photoresist application, masked exposure, etching, and diffusing or implanting are condensed into the block 200. This condensing allows focus upon the wafer backside related steps of the present invention. As is indicated in the block 200, these fabrication steps are accomplished, for example, on a gallium arsenide wafer of normal thickness, the typical thickness of 625 μm being indicated in the block 200. As a result of this relatively large wafer thickness, wafer fragility is not an unusually difficult aspect of the processing represented in the block 200.

After completion of the integrated circuit fabrication steps of block 200, and often prior to testing of the completed circuits, the semiconductor wafer used in the block 200 processing is subjected to mechanical abrasion steps such as lapping and polishing in order to remove undesirable wafer thickness material from the backside of the now circuit-invested wafer. This wafer thinning, lapping and polishing is often required prior to testing because the fabricated circuits do not become fully functional until the desired wafer thickness is achieved—e.g., the circuit included transmission lines may be inoperative prior to wafer thinning.

A convenient way to accomplish this mechanical lapping and polishing involves attaching the wafer by adhesion of, for example, a low temperature melting wax to a rotatable chuck member as is indicated in the block 202 of FIG. 2. During this block 202 step, the finished wafer is mounted in a face-down or circuit side to chuck-face adjacency posture using a thin layer of spin-on wax which is held at a temperature near 160° C. during a wax spinning and wafer placement step sequence. Upon cooling of the spin-on wax, the finished wafer is securely attached to the spinnable chuck member—to a degree permitting the backside lapping and polishing mechanical abrasion necessary to remove about 525 μm of thickness from the 625 μm typical wafer. As a result of this removal process, the completed wafer preferably has a thickness near 100 μm. As mentioned above, in the case of power handling and other predetermined types of integrated circuits the wafer may have a thickness in the range of 75 μm or even 50 μm.

In practice it is found that the wax attachment of a wafer to a spinnable chuck member can be accomplished to have wax thickness variations in the range of 3 to 4 μm. The lapping and polishing sequence can achieve wafer thickness variations that are not greater than 3 μm positive and negative. The wafer thinning step is indicated at 204 in FIG. 2.

This thinning is followed by the etching of via apertures as is indicated at 206 in the FIG. 2 sequence. The via etching of block 206 is continued through the entire thickness of the wafer, as is indicated for the via illustrated at 106 in FIG. 1. The etching continues until the lower side of the circuit pad 110 or other topside conductor is exposed through the via aperture. This is followed by deposition of the backside metallic layer 112 which, as is indicated above, is preferably gold in the case of a gallium arsenide MMIC wafer. The gold deposition is indicated in the block 208 of FIG. 2 and is preferably accomplished to a thickness of 3 to 10 μm by way of an electroplating process.

It is notable that the now mechanically fragile wafer which was thinned in the block 204 remains on the glass carrier or silicon wafer or similar support device (by way of the wax attachment accomplished in the block 202) during the steps of the block 204, 206, 208 and 210 in FIG. 2.

Deposition of the substrate strengthening layer of material 114 is accomplished in the block 210 of FIG. 2. As is indicated in this block 210, silicon nitride or silicon dioxide or diamond-related materials are desirably used in forming the layer 114. When composed of silicon nitride material, the layer 114 preferably has a thickness of 0.3 to 0.6 micrometer or 3000 to 6000 angstroms. When composed of the silicon dioxide material a thickness of 0.3 to 0.6 micrometer is desirable and when composed of the diamond related materials disclosed above a thickness greater than 0.5 micrometer is desirable at 114 in FIG. 1.

When the block 210 step is accomplished using silicon nitride on the gold metal conductor of a gallium arsenide wafer substrate member, the silicon nitride layer can be deposited by plasma enhanced chemical vapor deposition (PECVD). A temperature of 100° C. and a pressure of 850 millitort maintained for period of 35 minutes of PECVD is capable of providing the desired 0.3 to 0.6 micrometers of layer thickness.

The silicon nitride material indicated in the block 210 is attractive for use in the present backside layer invention for a number of reasons including the frequent use of plasma deposited silicon nitride as a dielectric material in integrated circuit fabrication. This use includes, for example, its use in metal-insulator-metal capacitors of the type shown at 104 in FIG. 1 in wafer front side circuits. Silicon nitride is also frequently used as a protective coating over the active areas of an integrated circuit. In addition, silicon nitride is often used in wafer backside processing as a masking material to protect the gallium arsenide or other substrate material while etching via holes, for example. With this frequent use of silicon nitride in front side or topside and backside wafer fabrication, it is therefore an easy step to also use silicon nitride in fabricating the backside strengthening layer 114.

Upon completion of the layer 114 deposition, the completed wafer is of sufficient mechanical strength to be conveniently handled and may be removed from the glass or other carrier member by heating to the melting temperature of the wax, a temperature of 160° C. as is indicated in the blocks 212 and 202.

With the removed wafer thinned to the desired thickness of gallium arsenide, the transmission line and other substrate thickness responsive elements in the wafer circuit are now in an operable condition and the wafer may be probe tested for electrical functionality—as is indicated in the block 214. Computerized probe testing with appropriate DC voltages and radio frequency signals communicated in and out of the integrated circuit is well known in the circuit electrical art. This testing terminates with appropriate marking or remembering of defective die in preparation for the scribing and breaking or other die segregation steps indicated in the block 218 of FIG. 2.

Upon removal of the wafer from the carrier in the block 212, the step of the optional block 214 in FIG. 2 may be accomplished. According to this optional step the backside film applied during the step 210 may be removed from the wafer in situations where presence of this film is undesirable in the finished circuit die. According to this arrangement, therefore, the film layer 214 may be used as either a manufacturing expedient for circuit die, an expedient which is especially helpful during the probe testing of a completed wafer, or alternately may be used as a permanently retained film on the mounted and packaged circuit die.

Removal of the layer 114 may be desirable where overall electrical contact with the gold or other backside layer is desired or where circuit die thickness is very limited. Removal of the layer 114 may be accomplished, as is indicated at 216 in FIG. 2, while the wafer is in integral condition. Alternately, the removal may be accomplished on an individual circuit die basis (with some die handling difficulty) following the step 218. The latter post scribe and break removal of the layer 114 offers the advantage of not returning the integral wafer to the damage susceptible thin wafer condition, but does necessitate the handling of individual circuit die. Removal of the layer 114 may be accomplished by use of a Buffered Oxide Etch (BOE), as is well known in the integrated circuit art in the case of silicon dioxide or silicon nitride compositions for the layer 114. Layer removal is, of course, not desirable when the layer 114 is composed of one of the diamond-related materials described above in view of the expense and fabrication difficulty attending these materials and their desirable heat conduction properties.

Upon completion of the wafer division into good and bad circuit die by the scribe and break or similar operations indicated at block 218 the now-tested circuit die may be mounted in ceramic packages or otherwise arranged for permanent electrical connection according to procedures which are known in the integrated circuit art.

The additional backside layer of the present invention is found to provide a significant degree of increased mechanical immunity to an otherwise thin wafer of very brittle semiconductor material such as gallium arsenide. This increased mechanical strength and immunity to inadvertent physical abuse significantly improves the handleability of wafers of this type and contributes to lower occurrence of wafer breakage. Thereby the invention contributes to improved yields in circuits which are inherently of somewhat higher manufacturing cost. When this additional layer is accomplished with the silicon nitride material, the additional layer is fully compatible with MMIC fabrication processes and in fact, is merely a repetition use of material often employed on the wafer's front side, or backside, for such as the capacitor insulating layer 128, for example. It is especially notable that the thin wafers of gallium arsenide semiconductor material described herein may be subjected to probe oriented microwave frequency testing without the use of carriers or other supporting arrangements.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. Microwave monolithic integrated electrical circuit die apparatus comprising the combination of:
   a die substrate member portion of a gallium arsenide semiconductor wafer, said substrate member having a thickness less than two hundred micrometers;
   a multiple layered microwave monolithic integrated electrical circuit disposed over a frontal surface portion of said die substrate member;
   a metallic layer member disposed over a backside surface portion of said die substrate member, said metallic layer member having electrical connection with a predetermined frontal surface electrical node of said electrical circuit; and
   a thin film layer of die strengthening electrical insulating material received over said metallic layer member on said backside surface portion of said die substrate member;
   said thin film layer being comprised of one of the materials of silicon nitride, silicon dioxide, monocrystalline diamond, polycrystalline diamond, and diamond-like carbon.

2. Microwave monolithic integrated electrical circuit die apparatus comprising the combination of:
   a die substrate member portion of a gallium arsenide semiconductor wafer, said substrate member having a thickness less than one hundred fifty, micrometers;
   a multiple layered microwave monolithic integrated electrical circuit disposed over a frontal surface portion of said die substrate member;
   a metallic layer member disposed over a backside surface portion of said die substrate member, said metallic layer member having electrical connection with a predetermined frontal surface electrical node of said electrical circuit; and
   a thin film layer of die strengthening electrical inslating material of thickness between three-tenths and six-tenths of a micrometer received over said metallic layer member on said backside surface portion of said die substrate member.

3. The die apparatus of claim 1 wherein said metallic layer member is comprised of metallic gold.

4. The die apparatus of claim 1 wherein said microwave monolithic integrated electrical circuit includes an electrical transmission line element which includes ground plane effects from said metallic layer member.

* * * * *